(12) United States Patent
Volpone et al.

(10) Patent No.: US 9,906,003 B1
(45) Date of Patent: Feb. 27, 2018

(54) DEVICE AND METHOD FOR SPLICING SHIELDED WIRE CABLES

(71) Applicant: Delphi Technologies, Inc., Troy, MI (US)

(72) Inventors: Thomas A. Volpone, Cortland, OH (US); Troy A. Iler, Salem, OH (US)

(73) Assignee: Delphi Techologies, Inc., Troy, MI (US)

( * ) Notice: Subject to any disclaimer, the term of this patent is extended or adjusted under 35 U.S.C. 154(b) by 0 days.

(21) Appl. No.: 15/436,894

(22) Filed: Feb. 20, 2017

Related U.S. Application Data

(63) Continuation-in-part of application No. 15/375,464, filed on Dec. 12, 2016.

(51) Int. Cl.
| | |
|---|---|
| *H02G 1/00* | (2006.01) |
| *H01B 7/00* | (2006.01) |
| *H01B 7/282* | (2006.01) |
| *H05K 9/00* | (2006.01) |
| *H01B 5/02* | (2006.01) |
| *H01B 13/012* | (2006.01) |
| *H02G 15/18* | (2006.01) |
| *H01R 4/02* | (2006.01) |
| *H01R 4/70* | (2006.01) |

(52) U.S. Cl.
CPC .............. *H02G 1/005* (2013.01); *H01B 5/02* (2013.01); *H01B 7/0045* (2013.01); *H01B 7/282* (2013.01); *H01B 13/01209* (2013.01); *H01R 4/029* (2013.01); *H01R 4/70* (2013.01); *H02G 15/18* (2013.01); *H05K 9/0098* (2013.01)

(58) Field of Classification Search
CPC .......... H02G 1/005; H02G 15/18; H01B 5/02; H01B 7/0045; H01B 7/282; H01B 13/01209; H01R 4/029; H01R 4/70; H05K 9/0098
USPC ....................................................... 174/72 A
See application file for complete search history.

(56) References Cited

U.S. PATENT DOCUMENTS

| | | | | |
|---|---|---|---|---|
| 9,196,887 | B2* | 11/2015 | Sasada .................. | H01M 2/206 |
| 2002/0004322 | A1* | 1/2002 | Takamura ............ | H01R 31/085 |
| | | | | 439/76.1 |
| 2002/0016104 | A1* | 2/2002 | Maegawa .......... | H01R 13/6273 |
| | | | | 439/502 |
| 2003/0045146 | A1* | 3/2003 | Sugata .................. | B60R 16/027 |
| | | | | 439/154 |

(Continued)

FOREIGN PATENT DOCUMENTS

WO 2014070851 A1 5/2014

*Primary Examiner* — Timothy Thompson
*Assistant Examiner* — Charles Pizzuto
(74) *Attorney, Agent, or Firm* — Robert J. Myers

(57) ABSTRACT

A wire cable assembly, such as those used in electric or hybrid electric vehicles, having a plurality of shielded wire cables that are spliced together is presented. The assembly includes a splicing device having a generally planar bus bar formed of a conductive material, wherein the exposed core conductors of the shielded wire cables are welded to the bus bar, thereby electrically interconnecting the exposed core conductors. A conductive sleeve encloses bus bar and interconnects the shield conductors of the shielded wire cables, providing shielding for the exposed core conductors and continuity for the shield conductors. An outer insulator enclosing the conductive sleeve. A method of splicing shielded wire cables using such a device is also presented herein.

12 Claims, 8 Drawing Sheets

(56) References Cited

U.S. PATENT DOCUMENTS

2017/0179460 A1* 6/2017 Gotoh ................ H01M 2/1077

* cited by examiner

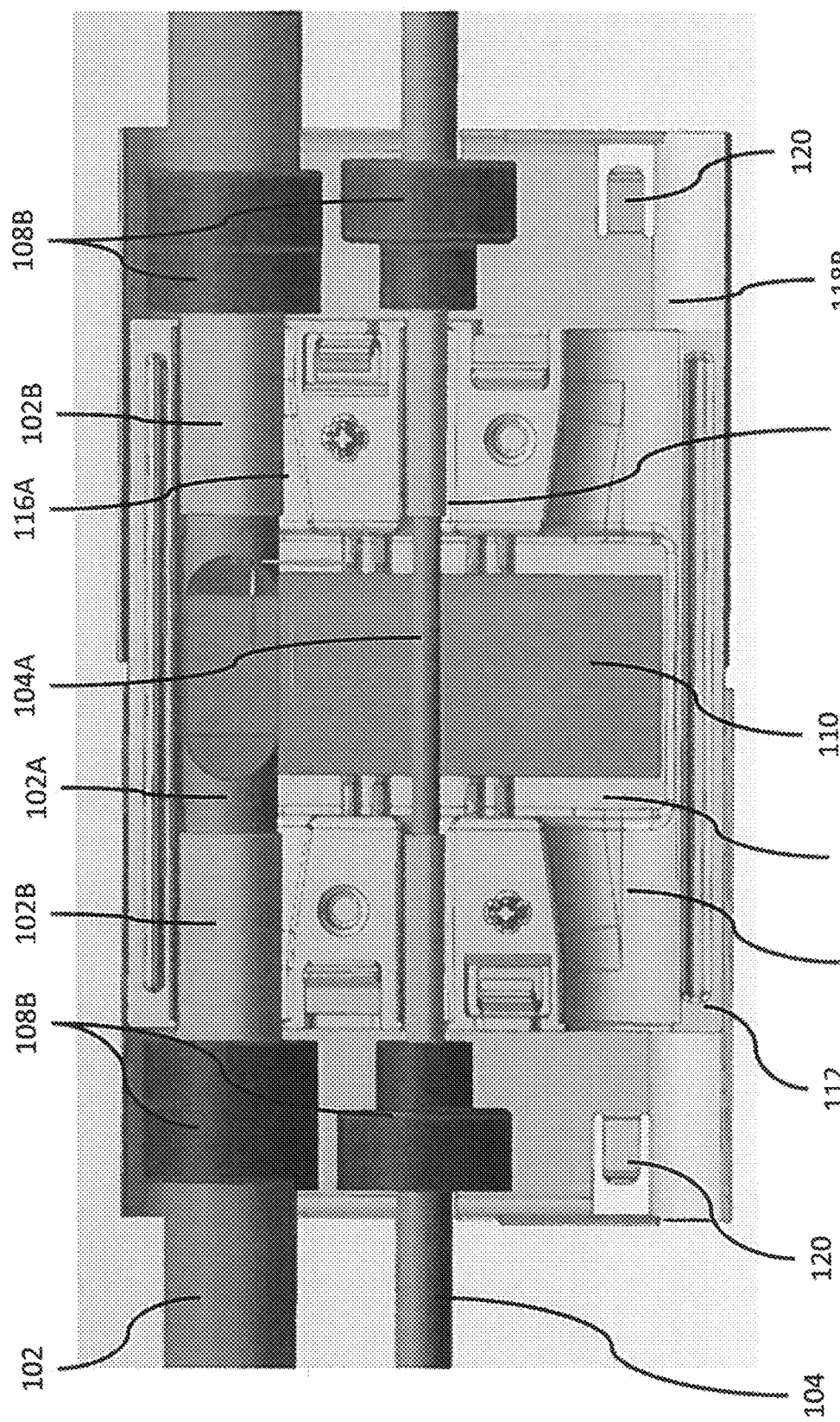

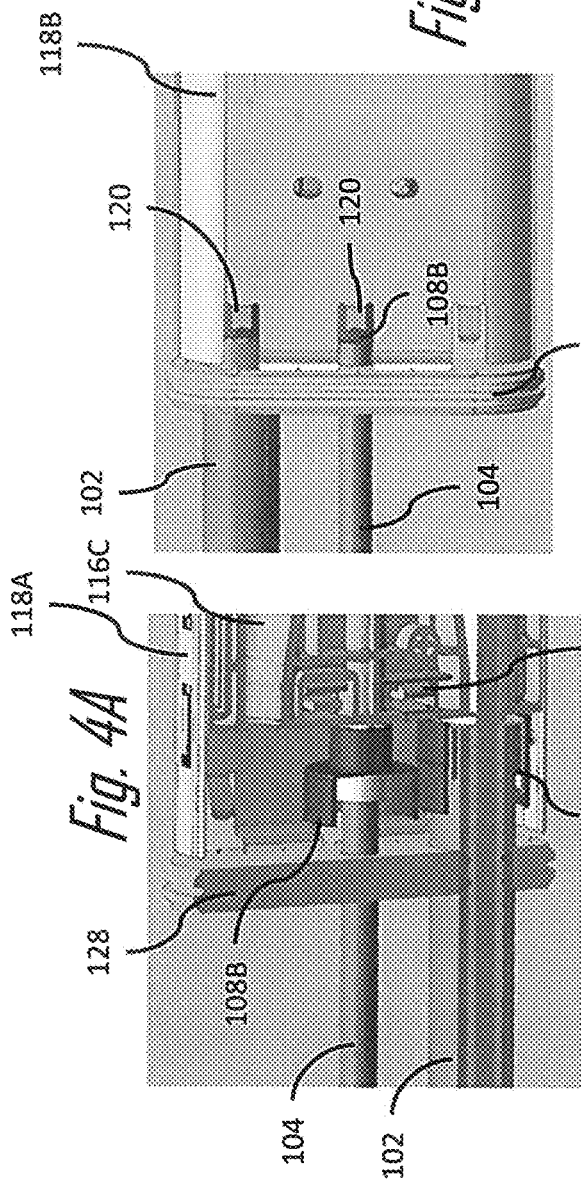
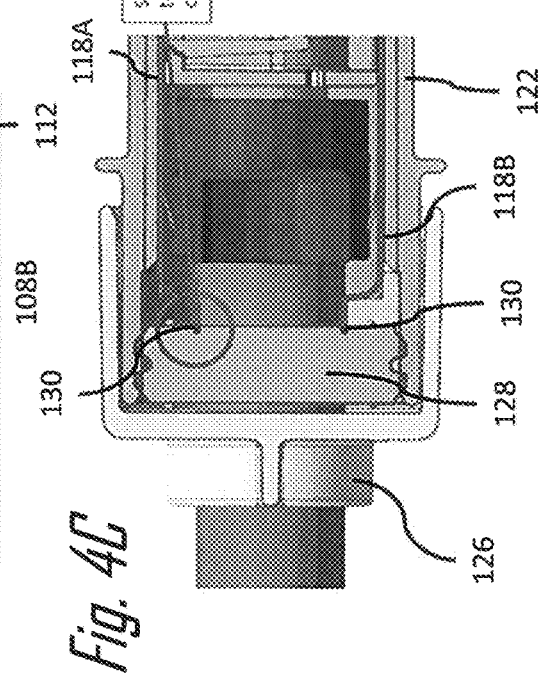
Fig. 4A Fig. 4B Fig. 4C Fig. 4D

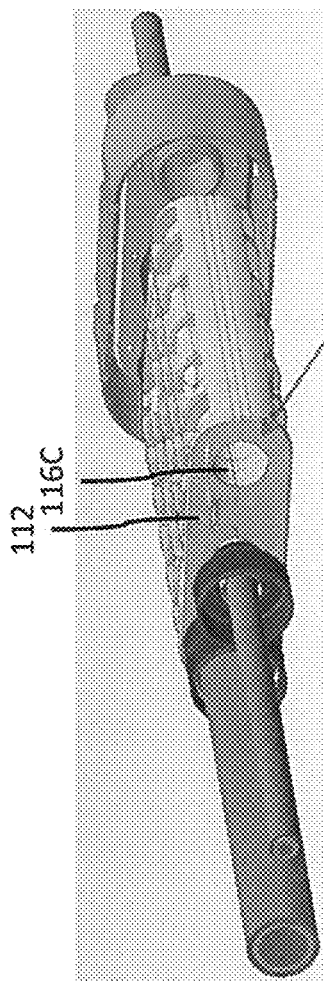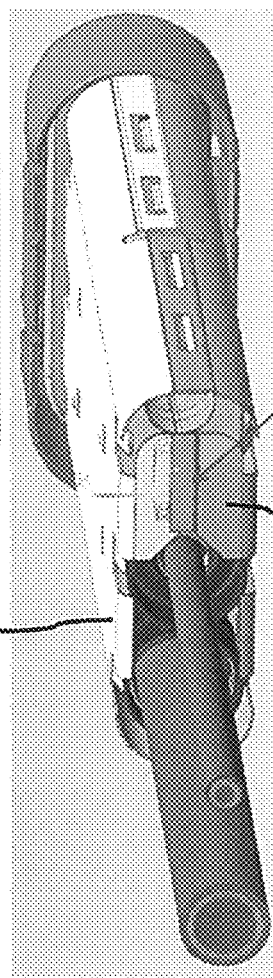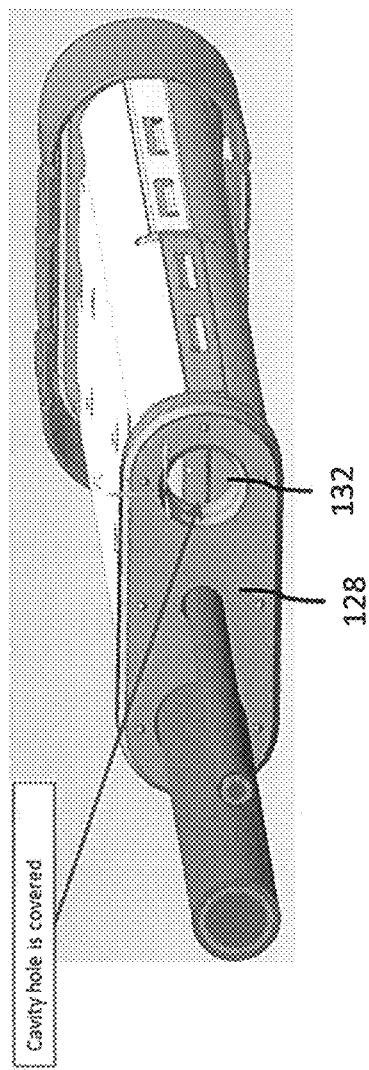

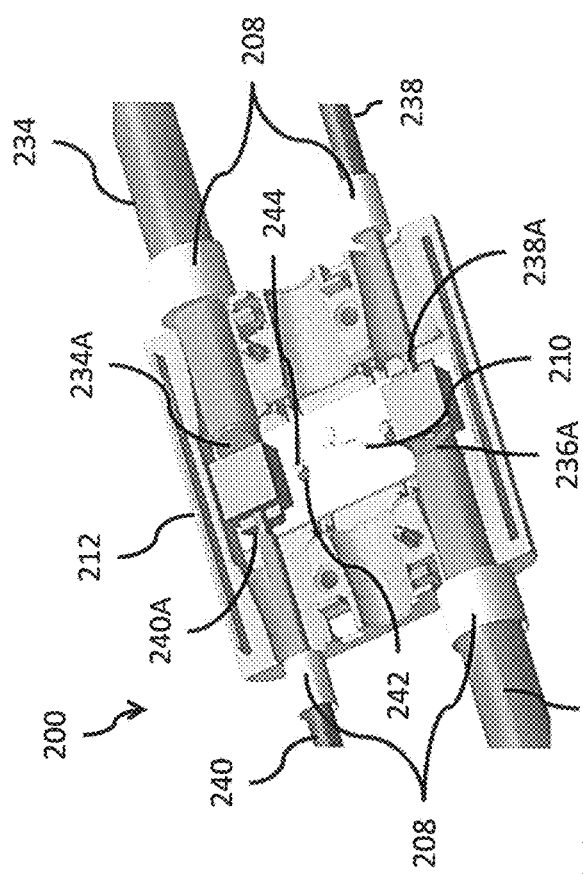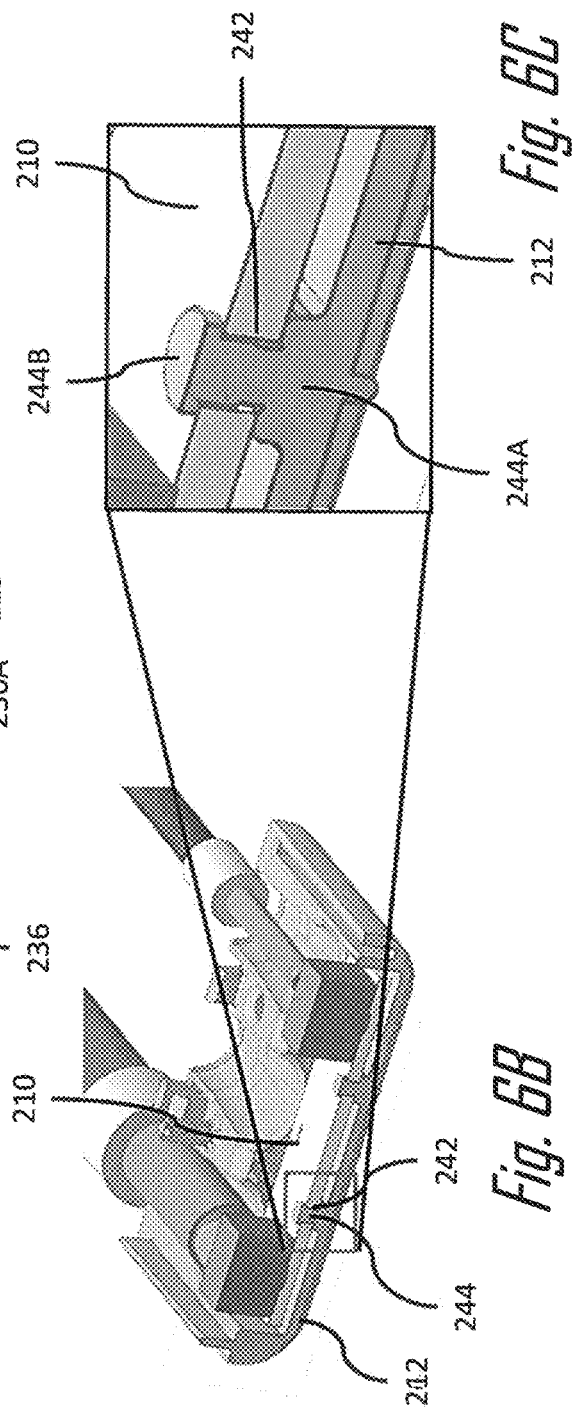

DEVICE AND METHOD FOR SPLICING SHIELDED WIRE CABLES

CROSS-REFERENCE TO RELATED APPLICATION

This application is a continuation-in-part application and claims benefit under 35 U.S.C. § 120 of U.S. patent application Ser. No. 15/375,464, filed Dec. 12, 2016, the entire disclosure of which is hereby incorporated herein by reference.

TECHNICAL FIELD OF THE INVENTION

The invention generally relates to a splicing device and a method for joining shielded wire cables.

BACKGROUND OF THE INVENTION

Shielded wire cables typically include an insulated center conductor and a separate insulated shield conductor surrounding the center conductor insulation. The shield conductor may consist of a braided wire mesh, metal foil, or metalized film. The cables typically have a second insulation layer covering the shield conductor. Shielded wire cables have been long used for communications systems, such as in cable television transmission lines. Shielded wire cables are also finding use in high voltage applications in electric and hybrid electric vehicles. When shielded wire cables are spliced together, there is usually a need to electrically connect the shield conductors of the spliced cables as well as the center conductor, in order to maintain electrical continuity of the shield conductors. Interconnecting the shield conductors may be complicated because the shield conductors must be cut back from the spliced ends of the cable in order to join the center conductors. Interconnecting the shield conductors may be further complicated in a one-to-many splicing configuration, sometimes referred to as a Y-splice or H-splice.

A splicing device and a method for splicing shielded wire cables is described in International Patent Publication No. 2014/070851 published May 8, 2014, herein incorporated by reference in its entirety. According to the splicing device 10 shown in FIGS. 1A and 1B, the core conductors 12 of the shielded cables 14 are spliced together by sonically welding them to one another and placed within an inner insulator 16 that insulates the welded core conductors 18. The inner insulator is placed inside a conductive sleeve, i.e. a shield 20, that interconnects conductive ferrules 22 attached to the shield conductors of the shielded cables 14, thereby providing electrical continuity of the shield conductors 14 over the spliced core conductors 18. The shield 20 is placed inside an outer insulator, i.e. a housing 24 that includes cable seals 26 and end caps 28 to retain the seals 26 within the housing 24. This splicing device 10 requires a "fan out" of the core conductors 12 from the welded splice 18. This "fan-out" increases the length of cable required and increase the overall length of the splicing device 10. Therefore, an alternative splicing device and a method of splicing shielded cables that reduces the overall cable and splicing device length remains desired.

At the time of filing this application, the invention described in this application and the invention described in International Patent Publication No. 2014/070851 are co-owned by Delphi Technologies, Inc.

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches, which in and of themselves may also be inventions.

BRIEF SUMMARY OF THE INVENTION

In accordance with an embodiment of this invention, a wire harness assembly is provided. The wire harness assembly includes a first shielded wire cable having a first exposed shield conductor and a first exposed core conductor, a second shielded wire cable having a second exposed shield conductor and a second exposed core conductor, a third shielded wire cable having a third exposed shield conductor and a third exposed core conductor, a fourth shielded wire cable having a fourth exposed shield conductor and a fourth exposed core conductor and a generally planar bus bar formed of a conductive material. The first, second, third, and fourth exposed core conductors are welded to the bus bar, thereby electrically connecting the first, second, third, and fourth exposed core conductors. The wire harness assembly further includes a conductive sleeve enclosing a portion of the first, second, third, and fourth exposed shield conductors, an inner insulator enclosing the bus bar and disposed within the conductive sleeve, and an outer insulator enclosing the conductive sleeve.

The bus bar may define a closed ended longitudinal slot extending therethrough and the inner insulator may include a post having a bottom portion attached to the inner insulator and a top portion extending through the longitudinal slot.

The post may be formed of a thermoplastic material. The post may by moveable within the longitudinal slot until the top portion of the post is thermally deformed to stake the bus bar to the inner insulator, thereby forming an interference fit between the thermally deformed top portion of the post and the bus bar. This interference fit inhibits movement of the post within the longitudinal slot. The post and the inner insulator may be integrally formed of the same thermoplastic material.

In accordance with another embodiment of this invention, a method of splicing shielded wire cables together is provided. The method includes the steps of:

providing a first shielded wire cable having a first exposed shield conductor and a first exposed core conductor;

providing a second shielded wire cable having a second exposed shield conductor and a second exposed core conductor;

providing a third shielded wire cable having a third exposed shield conductor and a third exposed core conductor;

providing a fourth shielded wire cable having a fourth exposed shield conductor and a fourth exposed core conductor;

providing a first, second, third, and fourth ferrule;

attaching the first, second, third, and fourth ferrules to the first, second, third, and fourth shield conductors respectively;

providing a generally planar bus bar formed of a conductive material;

providing a conductive sleeve;

providing an inner insulator formed of a thermoplastic material;

disposing the bus bar within the inner insulator while disposing the post within the longitudinal slot;

aligning the first, second, third, and fourth ferrules with the bus bar;

welding the first, second third, and fourth exposed core conductors to the bus bar, thereby electrically connecting the first, second third, and fourth exposed core conductors;

aligning the first, second, third, and fourth ferrules relative to the inner insulator by moving the post within the longitudinal slot;

disposing the inner insulator and the first, second, third, and fourth exposed shield conductors within the conductive sleeve;

attaching the first, second, third, and fourth ferrules to the conductive sleeve, thereby providing a conductive path between the first, second, third, and fourth exposed shield conductors;

providing an outer insulator formed of a nonconductive material; and disposing the conductive sleeve within the outer insulator.

The bus bar may define a closed ended longitudinal slot extending therethrough and the inner insulator may include a post having a bottom portion attached to the inner insulator and a top portion configured to extend through the longitudinal slot. The step of disposing the bus bar within the inner insulator may include the sub-step of disposing the post within the longitudinal slot. The method may further include the step of thermally deforming the top portion of the post to provide an interference fit between the post and the bus bar, thereby inhibiting movement of the post within the longitudinal slot. The post and the inner insulator may be integrally formed of the same thermoplastic material.

In accordance with yet another embodiment of this invention, a wire harness assembly is provided. The wire harness assembly is formed by the method listed above.

Further features and advantages of the invention will appear more clearly on a reading of the following detailed description of the preferred embodiment of the invention, which is given by way of non-limiting example only and with reference to the accompanying drawings.

BRIEF DESCRIPTION OF THE SEVERAL VIEWS OF THE DRAWING

The present invention will now be described, by way of example with reference to the accompanying drawings, in which:

FIG. 3 is a partial assembly view of the shielded wire harness assembly of FIG. 2 illustrating a relationship between the bus bar and the ferrules and the inner insulator and the ferrules in accordance with an embodiment;

FIG. 4A is cut away view of the shielded wire harness assembly of FIG. 2 illustrating an open cavity in accordance with an embodiment;

FIG. 4B is a partial assembly view of the shielded wire harness assembly of FIG. 2 illustrating an open cavity in accordance with an embodiment;

FIG. 4C is a cut away view of the shielded wire harness assembly of FIG. 2 illustrating a barb of the conductive sleeve penetrating the conductive seal in accordance with an embodiment;

FIG. 4D is another partial assembly view of the shielded wire harness assembly of FIG. 2 illustrating an open cavity in accordance with an embodiment;

FIGS. 5A-6C is a progressive assembly view of the shielded wire harness assembly of FIG. 2 illustrating an open cavity in accordance with an embodiment;

FIG. 6A is an exploded view of a shielded wire harness assembly having a spliced joint in accordance with an embodiment;

FIG. 6B is a close up cut away view of the shielded wire harness assembly of FIG. 6A illustrating an interface between a conductive elastomeric band and a shield conductor of a shielded wire cable in accordance with an embodiment;

FIG. 6C is a cut away view of the shielded wire harness assembly of FIG. 6A illustrating serrations on the conductive sleeve penetrating the conductive elastomeric band in accordance with an embodiment.

DETAILED DESCRIPTION OF THE INVENTION

Described herein are devices and a methods for splicing two or more shielded wire cables together. The devices and methods may be used to splice shielded wire cables with a single center conductor, i.e. solid wire, or multiple center connectors, i.e. stranded wire. The devices and methods described herein may also be used to splice two or more shielded wire cables to form a H-splice or Y-splice. The devices and methods described herein may be used for splicing a variety of shielded wire cables types, for example high voltage shielded wire cables designed for electrical or hybrid electrical vehicles.

Figure 1:
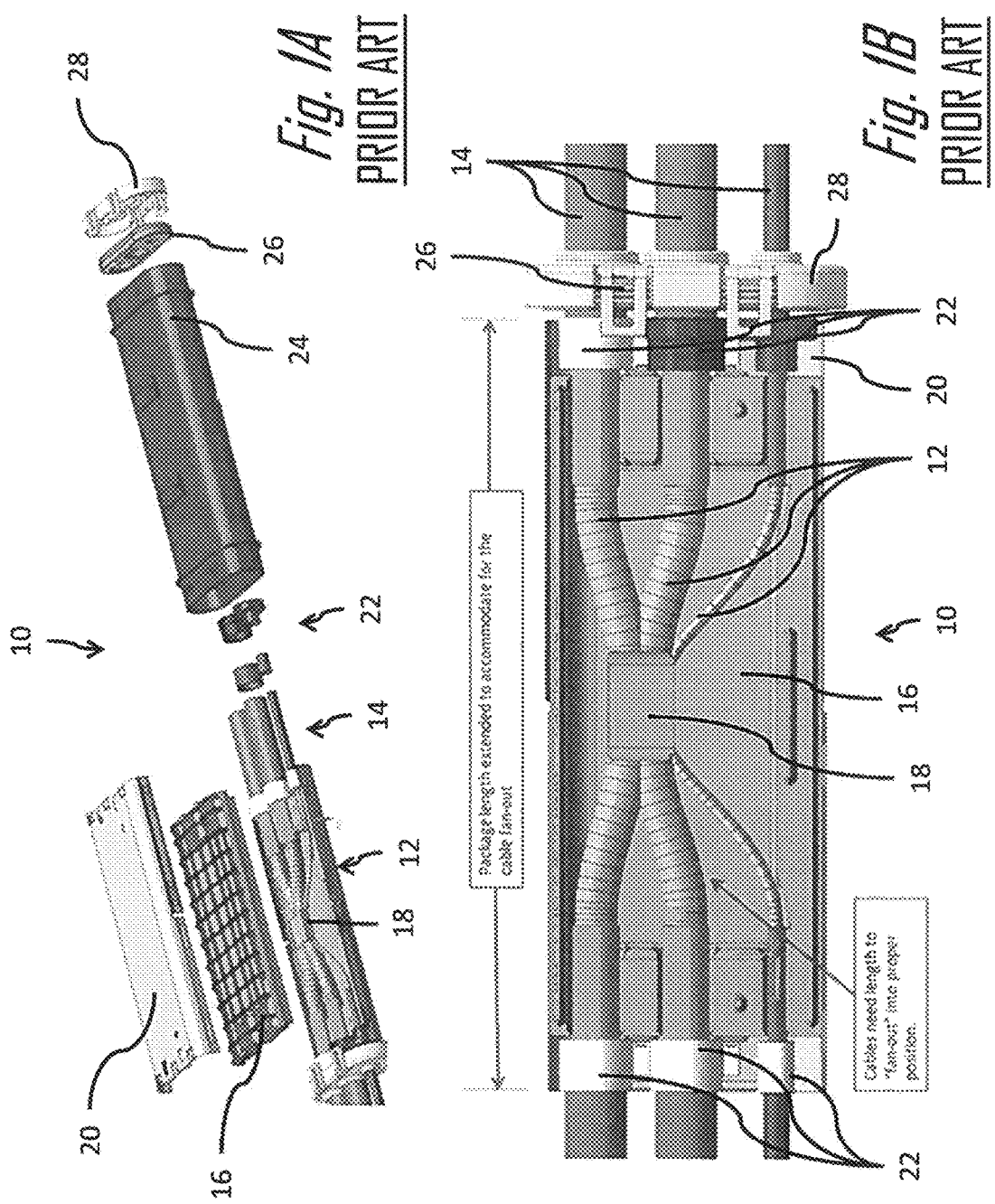
FIG. 1A is an exploded view of a shielded wire harness assembly having a spliced joint in accordance with the prior art.
FIG. 1B is a cut away view of the shielded wire harness assembly of FIG. 1A in accordance with the prior art.
Figure 2:
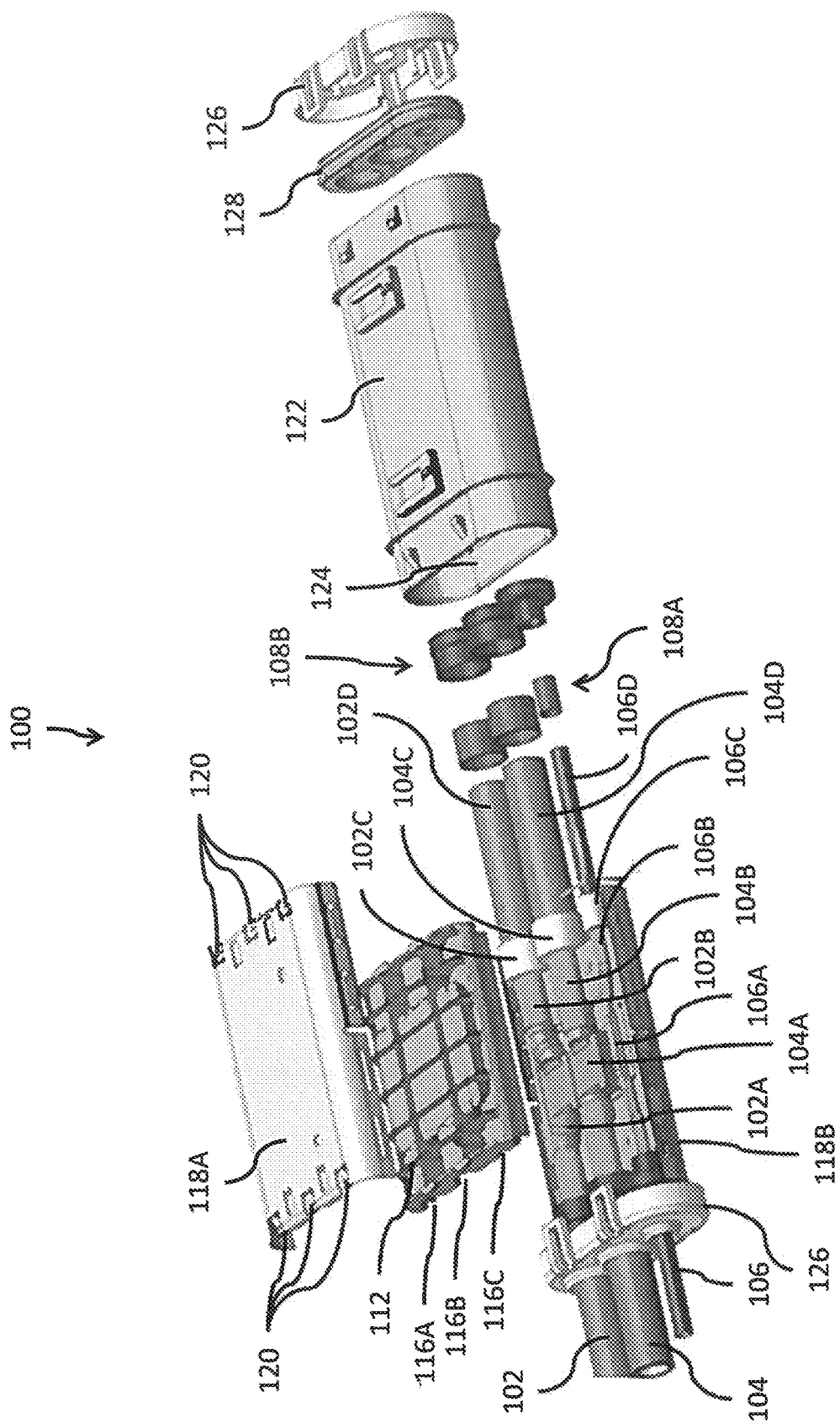
FIG. 2 is an exploded view of a shielded wire harness assembly having a spliced joint in accordance with an embodiment.

FIG. 2 illustrates a non-limiting example of a wire harness assembly, hereinafter referred to as the assembly 100 that includes three shielded wire cables 102, 104, 106 that are spliced together in a double H-splice configuration. The assembly 100 includes a device configured to make a splice connection between the three shielded wire cables 102, 104, 106, hereinafter referred to as a splicing device. The three shielded wire cables 102, 104, 106 each have a core conductor 102A, 104A, 106A respectively that is axially surrounded by an inner insulation jacket 102B, 104B, 106B respectively. The inner insulation jackets 102B, 104B, 106B are axially surrounded by a shield conductor 102C, 104C, 106C respectively. The shield conductors 102C, 104C, 106C are axially surrounded by an outer insulation jacket 102D, 104D, 106D respectively. The core conductors 102A, 104A, 106A are preferably formed of a stranded, i.e. multi-wire core but may also be formed of a solid single wire core. The shield conductors 102C, 104C, 106C are preferably formed of a woven wire mesh, but may also be formed of an electrical conductive foil, e.g. a copper foil, aluminum foil, or a metallized plastic foil.

As illustrated in FIG. 2, a portion of the inner insulation jackets 102B, 104B, 106B, shield conductors 102C, 104C, 106C, and outer insulation jackets 102D, 104D, 106D, are removed to expose a portion of the core conductors 102A, 104A, 106A. The inner insulation jackets 102B, 104B, 106B, shield conductors 102C, 104C, 106C, and outer insulation jackets 102D, 104D, 106D are center stripped so that this removal splits each of the shield conductors 102C, 104C, 106C into two separate shield conductors. Alternatively, the cables may be cut in two to form cut leads 234, 236, 238, 240 and the ends of the cut leads 234, 236, 238, 240 are stripped to expose a portion of the core conductors 234A, 236A, 238A, 240A as shown in FIG. 6A.

An additional portion of each of the shield conductors 102C, 104C, 106C may be removed or cut way to provide adequate voltage creepage distance to prevent a leakage current between the core conductors 102A, 104A, 106A and the shield conductors 102C, 104C, 106C, thereby exposing inner insulation jackets 102B, 104B, 106B of the shielded wire cables 102, 104, 106. The exposed shield conductors 102C, 104C, 106C are folded back over the outer insulation jackets 102D, 104D, 106D and an inner ferrule 108A is placed between the inner insulation jackets 102B, 104B, 106B and the exposed shield conductors 102C, 104C, 106C of each of the shielded wire cables 102, 104, 106 and an outer ferrule 108B is placed over each of the exposed shield conductors 102D, 104D, 106D to provide a robust connection point for the shield conductors 102D, 104D, 106D. The combination of the inner ferrules 108A and the outer ferrules 108B are hereinafter referred to as the ferrules 108. The ferrules 108 may be a closed or barrel-type ferrule that is attached to the shield conductors 102D, 104D, 106D by crimping or soldering prior to forming the connection or the ferrules 108 may be an open or clip-type ferrule that can be attached to the shield conductors 102D, 104D, 106D by crimping after forming the connection. Materials and methods used to attach the conductive ferrules 108 to the shield conductors 102C, 104C, 106C are well known to those skilled in the art.

FIG. 3 illustrates another non-limiting example of a wire harness assembly 100 having a splicing device wherein only two shielded cables 102 and 104 are spliced together. The exposed portions of the core conductors 102A, 104A are attached to an electrically conductive bus bar 110 to electrically interconnect the core conductors 102A, 104A. The bus bar 110 has a generally rectangular shape and the core conductors 102A, 104A are attached to one of the major surfaces of the bus bar 110 by a welding process, preferably a sonic welding process although other welding processes such as resistance welding, soldering, brazing may be employed. The bus bar 110 may be formed of an copper or aluminum based alloy. Alternatively, when the shielded wire cables are cut into cut leads 234, 236, 238, 240, the core conductors 234A, 236A, 238A, 240A are stacked or piggy-backed on one another when welded to the bus bar 210 as shown in FIG. 6A.

The assembly 100 includes an inner insulator 112 formed of dielectric thermoplastic material, such as glass-filled polyamide (commonly known by the trade name NYLON) or polybutylene terephthalate (PBT). The inner insulator 112 may be formed using an injection molding process or other plastic forming processes well known to those skilled in the art. The inner insulator 112 may be formed by two identical halves that are designed to enclose the bus bar 110, the exposed core conductors 102A, 104A and the exposed inner insulation jackets 102B, 104B of the shielded wire cables 102, 104.

The inner insulator 112 defines a lateral cavity 114 that is designed to accommodate the bus bar 110. The inner insulator 112 also defines three longitudinal cavities 116A, 116B, 116C extending from the lateral cavity 114 that are designed to accommodate the shielded wire cables 102, 104. As shown in FIG. 3, the size of the longitudinal cavities 116A, 116B, 116C may vary to accommodate shielded cables having different diameters.

The assembly 100 further includes a sleeve 118 formed of conductive material in which the inner insulator 112 is enclosed. The conductive material used to form the sleeve 118 is preferably a copper alloy, such as 425 brass and may be tin coated for corrosion resistance. The sleeve 118 defines contacts 120 that are designed to be in mechanical and electrical contact with the outer ferrules 108B attached to the shield conductors 102C, 104C, 106C of the shielded wire cables 102, 104, 106. The contacts 120 protrude from the sleeve 118 and form an arcuate shape configured to exert a spring force on the outer ferrules 108B.

As shown in FIGS. 4A and 4B, the sleeve 118 is made up of a first sleeve portion 118A that defines a first set of contacts 120 and a second sleeve portion 118B that defines a second set of contacts 120. The first sleeve portion 118A is configured to enclose the inner insulator 112 when mated with the second sleeve portion 118B. Features may be included in the joining surfaces of the first sleeve portion 118A and the second sleeve portion 118B to reduce electrical resistance between the two sleeve portions 118A, 118B. Alternatively, the first sleeve portion 118A and the second sleeve portion 118B may be secured together using conductive threaded fasteners. The first and second sleeve portions 118A, 118B may be designed with a hermaphroditic shape so that a single part may be used for both the first and second sleeve portions 118A, 118B. The inner insulator 112 may also be designed to have first and second portions with a hermaphroditic shape so that a single part may be used for both portions.

The assembly 100 further includes an outer insulator, hereinafter referred to as a housing 122 formed of a non-conductive material and defining a cavity 124 that is configured to enclose the sleeve 118. The assembly 100 also includes a pair of end caps 126 that are designed to sealably engage the shielded wire cables 102, 104, 106 and sealably engage the housing 122. The end caps 126 and outer housing 122 are designed to provide environmental protection by keeping contaminants such as dust, dirt, water, and other fluids away from to the exposed core conductors 102A, 104A, 106A, bus bar 110, and sleeve 118. The housing 122 and end caps 126 may be formed of a polymer material, such as NYLON or PBT. The end caps 126 may also include a sealing element formed of compliant material, such as silicone rubber, hereinafter referred to as seals 128.

In order to provide improved electromagnetic shielding, the seals 128 may be formed of an electrically conductive elastomeric material, such as a 30 durometer, high bleed silicone based material with carbon or copper impregnation. The conductive sleeve 118 may include pointed barbs 130, as shown in FIG. 4C, that extend from the ends of the sleeve 118 and pierce the seals 128 providing electrical continuity between the sleeve 118 and the seals 128 as shown in FIG. 4D. The conductive seals 128 may be used as shown in FIG. 4D when one of the longitudinal cavities 116A, 116B, 116C is unused to block an opening of an unused cavity 116C in the inner insulator 112.

As shown in FIGS. 5A-5C, alternatively or in addition to the conductive seals 128, the sleeve 118 may include tabs 132 that can be folded over an opening of an unused cavity 116C in the inner insulator 112.

A non-limiting example of another embodiment of the wire cable assembly 200 is illustrated in FIG. 6A-6C 100, hereinafter referred to as assembly 200. This wire cable assembly 200 is similar to the assembly 100 described above except rather than joining three center stripped shielded wire cables 102, 104, 106, this wire cable assembly 200 joins four shielded wire cables as cut leads 234, 236, 238, and 240 each having an exposed core conductor 234A, 236A, 238A, and 238A, an inner insulation jacket 234B, 236B, 238B, and 238B, and a shield conductors 234C, 236C, 238C, 240C. Similar elements in assembly 100 and assembly 200 are identified by having the same last two digits of the reference number. The bus bar 210 includes a pair of longitudinal slots 242 that are axially aligned with the shielded wire cables 234, 236, 238, and 240. In addition, the inner insulator 212 defines a pair of cylindrical posts 244 that are received within the slots 242. The posts 244 have a bottom portion 244A that is attached to the inner insulator 212 and a top portion 244B that extends through the slot. The posts 244 are formed of a thermoplastic material and are preferably integrally formed of the same thermoplastic material as the inner insulator 212. The slots 242 and posts 244 allow a limited amount of longitudinal movement of the bus bar 210 within the inner insulator 212 so that the ferrules 208 that are attached to the shield conductors 234C, 236C, 238C, 240C of the shielded wire cables 234, 236, 238, and 240 may be properly aligned with the contacts 120 of the conductive sleeve 118. Once the ferrules 208 are properly aligned, the top portion 244B is thermally deformed in a heat staking operation as shown in FIGS. 6B and 6C to create an interference fit between the posts 244 and the bus bar 210 so that movement of the post 244 within the slots 242 is inhibited and fixing the position of the bus bar 210 within the inner insulator 212. The tools and techniques used for heat staking are well known to those skilled in the art. As shown in FIG. 6C, the diameter of the bottom portion 244A may preferably be larger than the diameter of the top portion 244B.

While the slots 242 illustrated in FIG. 6A have two closed ends, other embodiments of the slots may be envisioned having one closed and one open end. Further, while the illustrated embodiment includes two cylindrical posts 244 and two slots 242, alternative embodiments may be envisioned having more or few posts and slots or different post shapes.

Figure 7:
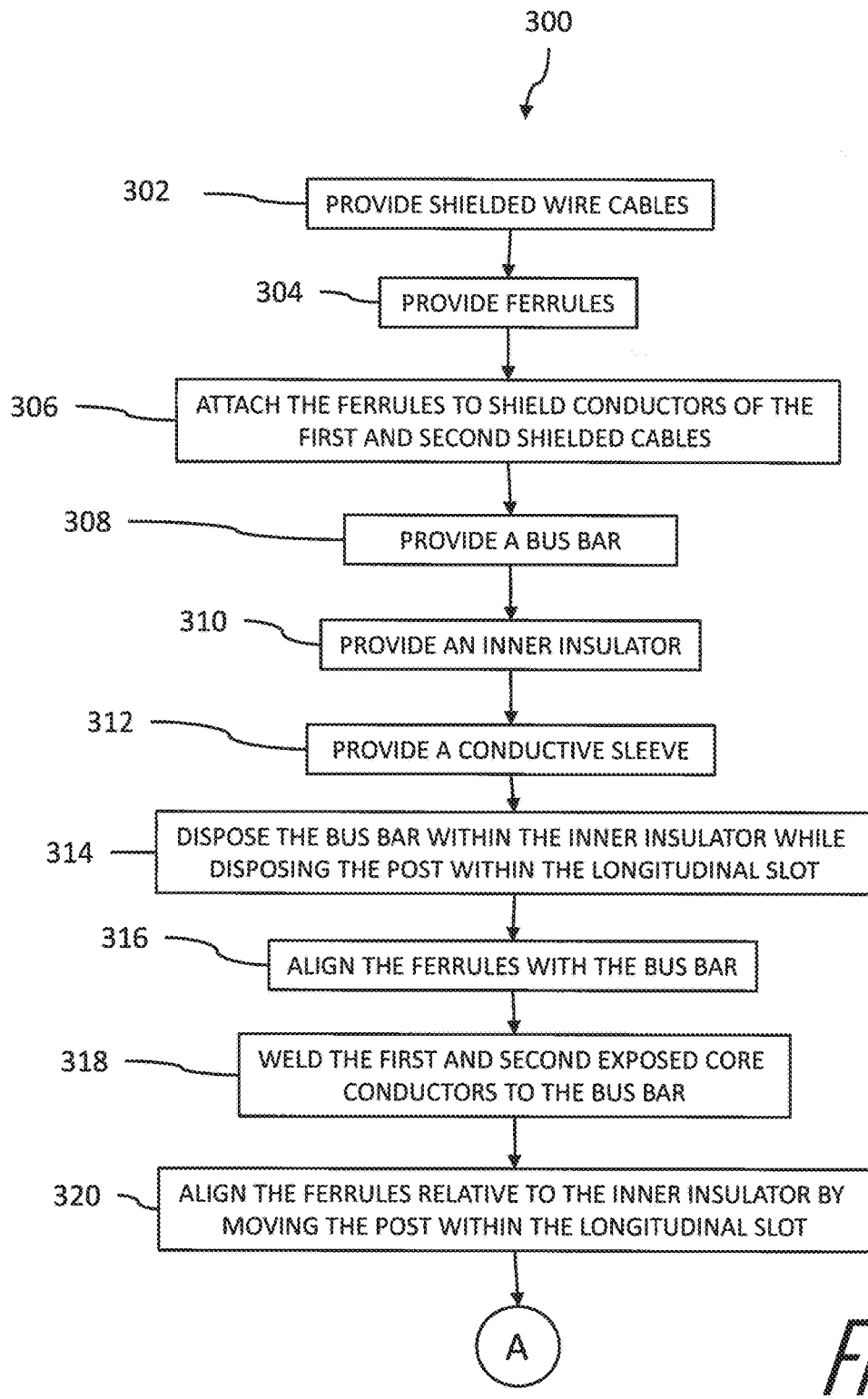
FIG. 7 is a flow chart of a method of splicing shielded wire cables together in accordance with another embodiment.
Figure 7:
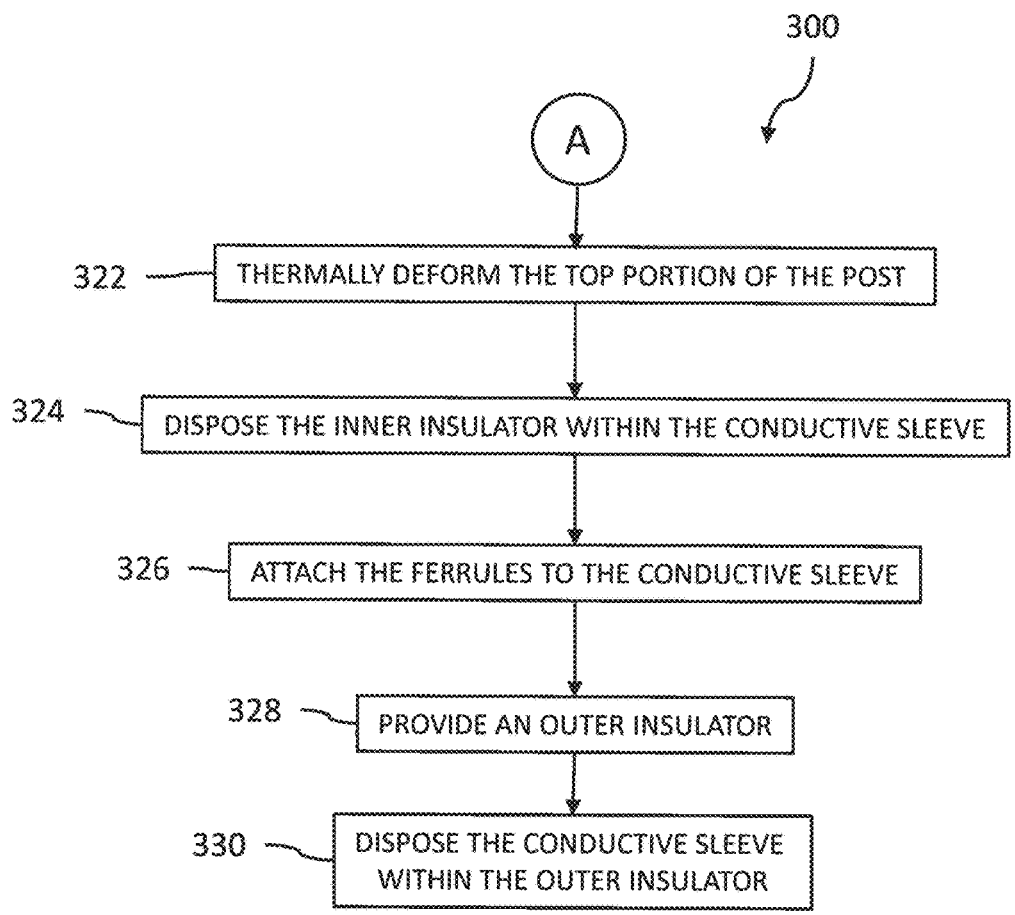

FIG. 7 illustrates a non-limiting method 300 of splicing shielded wire cables 234, 236, 238, and 240 together. The method 300 includes the following steps.

STEP 302, PROVIDE SHIELDED WIRE CABLES, includes providing a first shielded wire cable 234 having a first exposed shield conductor 234C and a first exposed core conductor 234A, providing a second shielded wire cable 236 having a second exposed shield conductor 236C and a second exposed core conductor 236A, providing a third shielded wire cable 238 having a third exposed shield conductor 238C and a third exposed core conductor 238A, and providing a fourth shielded wire cable 240 having a fourth exposed shield conductor 240C and a fourth exposed core conductor 240C.

STEP 304, PROVIDE FERRULES, includes providing a ferrule 208 for each cable, each ferrule 208 including an inner ferrule and an outer ferrule.

STEP 306, ATTACH THE FERRULES TO SHIELD CONDUCTORS OF THE SHIELDED CABLES, includes attaching the ferrules 208 to the first, second, third, and fourth shield conductors 234C, 236C, 238C, 240C respectively.

STEP 308, PROVIDE A BUS BAR, includes providing a generally planar bus bar 210 formed of a conductive material. The bus bar 210 may defining a closed ended longitudinal slot 242 extending through the bus bar 210.

STEP 310, PROVIDE AN INNER INSULATOR, includes providing an inner insulator 212 formed of a thermoplastic material. The inner insulator 212 may include a post 244 having a bottom portion 244A attached to the inner insulator 212 and a top portion 244B configured to extend through the longitudinal slot 242.

STEP 312, PROVIDE A CONDUCTIVE SLEEVE, includes providing a conductive sleeve 118.

STEP 314, DISPOSE THE BUS BAR WITHIN THE INNER INSULATOR, includes disposing the bus bar 210 within the inner insulator 212. STEP 314 may include an optional sub-step of disposing the post 244 within the longitudinal slot 242 when the bus bar 210 includes the slot 242 and the inner insulator 112 has the post 244.

STEP 316, ALIGN THE FERRULES WITH THE BUS BAR, includes aligning the first, second, third, and fourth ferrules 208 with the bus bar 210 so that the ferrules 208 are a proper, preferably an equal distance, from the edges of the bus bar 210.

STEP 318, WELD THE EXPOSED CORE CONDUCTORS TO THE BUS BAR, includes welding the first, second, third, and fourth exposed core conductors 234A, 236A, 238A, 240A to the bus bar 210, thereby electrically interconnecting the first, second, third, and fourth exposed core conductors 234A, 236A, 238A, 240A.

STEP 320, ALIGN THE FERRULES WITH THE INNER INSULATOR, includes aligning the first, second, third, and fourth ferrules 208 relative to the inner insulator 212 by moving the post 244 within the longitudinal slot 242 so that the ferrules 208 are a proper, preferably an equal distance, from the edges of the inner insulator 212. STEP 320 is beneficial in properly aligning the ferrules 108 with the contacts 120 of the conductive sleeve 118.

STEP 322, THERMALLY DEFORM THE TOP PORTION OF THE POST, is an optional step that includes thermally deforming the top portion 244B of the post 244 to provide an interference fit between the post 244 and the bus bar 110, thereby inhibiting movement of the post 244 within the longitudinal slot 242.

STEP 324, DISPOSE THE INNER INSULATOR WITHIN THE CONDUCTIVE SLEEVE, includes disposing the inner insulator 212 and the first, second, third, and fourth shield conductors 234C, 236C, 238C, 240C within the conductive sleeve 118.

STEP 326, ATTACH THE FERRULES TO THE CONDUCTIVE SLEEVE, includes attaching the first, second, third, and fourth contacts 120 of the conductive sleeve 118 to the first, second, third, and fourth ferrules 208, thereby electrically interconnecting the first, second, third, and fourth shield conductors 234C, 236C, 238C, 240C though the conductive sleeve 118.

STEP 328, PROVIDE AN OUTER INSULATOR, includes providing an outer insulator 122 formed of a nonconductive material.

STEP 330, DISPOSE THE CONDUCTIVE SLEEVE WITHIN THE OUTER INSULATOR, includes disposing the conductive sleeve 118 within the outer insulator 122.

Accordingly, a wire cable assembly 100, 200 having a splice device and a method 300 for joining together shielded wire cables using such a device are provided. The splice device provides the benefit of a shorter overall length than existing splicing devices for shielded cables because it eliminates the "fan out" length. The length reduction offers advantages of packaging a wire harness assembly made with such as splicing device, for example in a motor vehicle. The inventors have observed a reduction in the overall length of the splice device of 38% compared to existing splice devices. Using cut leads 234, 236, 238, 240 rather than center stripped cables 102, 104, 106 provides benefits easier processing in the for stripping, ferrule attachment, and seal attachment. The posts 244 in the inner insulator 212 and the slots 242 in the bus bar 210 allow the ferrules 208 on the shielded cables 234, 236, 238, 240 to be moved for alignment with the contacts 120 of the conductive sleeve 118 and then be fixed in placed once properly aligned by heat staking the posts 244 to the bus bar 210.

While this invention has been described in terms of the preferred embodiments thereof, it is not intended to be so limited, but rather only to the extent set forth in the claims that follow. Moreover, the use of the terms first, second, etc. does not denote any order of importance, but rather the terms first, second, etc. are used to distinguish one element from another. Furthermore, the use of the terms a, an, etc. do not denote a limitation of quantity, but rather denote the presence of at least one of the referenced items. Additionally, directional terms such as upper, lower, top, bottom, etc. do not denote any particular orientation, but rather the terms upper, lower, top, bottom, etc. are used to distinguish one element from another and locational establish a relationship between the various elements.

We claim:

1. A wire harness assembly, comprising:
   a first shielded wire cable having a first exposed shield conductor and a first exposed core conductor;
   a second shielded wire cable having a second exposed shield conductor and a second exposed core conductor;
   a third shielded wire cable having a third exposed shield conductor and a third exposed core conductor;
   a fourth shielded wire cable having a fourth exposed shield conductor and a fourth exposed core conductor;
   a generally planar bus bar formed of a conductive material, wherein the first, second, third, and fourth exposed core conductors are welded to the bus bar, thereby electrically connecting the first, second, third, and fourth exposed core conductors;
   a conductive sleeve enclosing a portion of the first, second, third, and fourth exposed shield conductors;
   an inner insulator enclosing the bus bar and disposed within the conductive sleeve; and
   an outer insulator enclosing the conductive sleeve.

2. The wire harness assembly according to claim 1, wherein the bus bar defines a closed ended longitudinal slot extending therethrough and wherein the inner insulator includes a post having a bottom portion attached to the inner insulator and a top portion extending through the longitudinal slot.

3. The wire harness assembly according to claim 2, wherein the post is moveable within the longitudinal slot.

4. The wire harness assembly according to claim 2, wherein the post is formed of a thermoplastic material and wherein the top portion of the post is thermally deformed to stake the bus bar to the inner insulator.

5. The wire harness assembly according to claim 4, wherein an interference fit exists between the thermally deformed top portion of the post and the bus bar, thereby inhibiting movement of the post within the longitudinal slot.

6. The wire harness assembly according to claim 5, wherein the post and the inner insulator are integrally formed of the same thermoplastic material.

7. A method of splicing shielded wire cables together, comprising the steps of:
   providing a first shielded wire cable having a first exposed shield conductor and a first exposed core conductor;
   providing a second shielded wire cable having a second exposed shield conductor and a second exposed core conductor;
   providing a third shielded wire cable having a third exposed shield conductor and a third exposed core conductor;
   providing a fourth shielded wire cable having a fourth exposed shield conductor and a fourth exposed core conductor;
   providing a first, second, third, and fourth ferrule;
   attaching the first, second, third, and fourth ferrules to the first, second, third, and fourth shield conductors respectively;
   providing a generally planar bus bar formed of a conductive material;
   providing a conductive sleeve;
   providing an inner insulator formed of a thermoplastic material;
   disposing the bus bar within the inner insulator;
   aligning the first, second, third, and fourth ferrules with the bus bar;
   welding the first, second third, and fourth exposed core conductors to the bus bar, thereby electrically connecting the first, second third, and fourth exposed core conductors;
   aligning the first, second, third, and fourth ferrules relative to the inner insulator;
   disposing the inner insulator and the first, second, third, and fourth exposed shield conductors within the conductive sleeve;
   attaching the first, second, third, and fourth ferrules to the conductive sleeve, thereby providing a conductive path between the first, second, third, and fourth exposed shield conductors;
   providing an outer insulator formed of a nonconductive material; and
   disposing the conductive sleeve within the outer insulator.

8. The method according to claim 7, wherein the bus bar defines a closed ended longitudinal slot extending therethrough and the inner insulator includes a post having a bottom portion attached to the inner insulator and a top portion configured to extend through the longitudinal slot, wherein the step of disposing the bus bar within the inner insulator includes the sub-step of disposing the post within the longitudinal slot and wherein the method further comprises the step of thermally deforming the top portion of the post to provide an interference fit between the post and the bus bar, thereby inhibiting movement of the post within the longitudinal slot.

9. The method according to claim 8, wherein the post and the inner insulator are integrally formed of the same thermoplastic material.

10. A wire harness assembly having a spliced joint formed by a method comprising the steps of:
    providing a first shielded wire cable having a first exposed shield conductor and a first exposed core conductor;
    providing a second shielded wire cable having a second exposed shield conductor and a second exposed core conductor;
    providing a third shielded wire cable having a third exposed shield conductor and a third exposed core conductor;
    providing a fourth shielded wire cable having a fourth exposed shield conductor and a fourth exposed core conductor;
    providing a first, second, third, and fourth ferrule;

attaching the first, second, third, and fourth ferrules to the first, second, third, and fourth shield conductors respectively;

providing a generally planar bus bar formed of a conductive material;

providing a conductive sleeve;

providing an inner insulator formed of a thermoplastic material;

disposing the bus bar within the inner insulator;

aligning the first, second, third, and fourth ferrules with the bus bar;

welding the first, second third, and fourth exposed core conductors to the bus bar, thereby electrically connecting the first, second third, and fourth exposed core conductors;

aligning the first, second, third, and fourth ferrules relative to the inner insulator;

disposing the inner insulator and the first, second, third, and fourth exposed shield conductors within the conductive sleeve;

attaching the first, second, third, and fourth ferrules to the conductive sleeve, thereby providing a conductive path between the first, second, third, and fourth exposed shield conductors;

providing an outer insulator formed of a nonconductive material; and disposing the conductive sleeve within the outer insulator.

11. The wire harness assembly according to claim 10, wherein the bus bar defines a closed ended longitudinal slot extending therethrough and the inner insulator includes a post having a bottom portion attached to the inner insulator and a top portion configured to extend through the longitudinal slot, wherein the step of disposing the bus bar within the inner insulator includes the sub-step of disposing the post within the longitudinal slot and wherein the method further comprises the step of thermally deforming the top portion of the post to provide an interference fit between the post and the bus bar, thereby inhibiting movement of the post within the longitudinal slot.

12. The wire harness assembly according to claim 11, wherein the post and the inner insulator are integrally formed of the same thermoplastic material.

* * * * *